United States Patent
Bäcklund et al.

(10) Patent No.: US 8,629,015 B2
(45) Date of Patent: Jan. 14, 2014

(54) MANUFACTURING OF ELECTRONIC COMPONENTS

(75) Inventors: Tomas Bäcklund, Southampton (GB); Kaisa Lilja, Tampere (FI); Timo Joutsenoja, Tampere (FI)

(73) Assignee: Smartrac IP B.V., Amsterdam (NL)

( * ) Notice: Subject to any disclaimer, the term of this patent is extended or adjusted under 35 U.S.C. 154(b) by 39 days.

(21) Appl. No.: 13/381,844

(22) PCT Filed: Jul. 3, 2009

(86) PCT No.: PCT/FI2009/050613
§ 371 (c)(1), (2), (4) Date: Mar. 23, 2012

(87) PCT Pub. No.: WO2011/001007
PCT Pub. Date: Jan. 6, 2011

(65) Prior Publication Data
US 2012/0175621 A1   Jul. 12, 2012

(51) Int. Cl.
*H01L 21/8238* (2006.01)

(52) U.S. Cl.
USPC .......... 438/199; 438/197; 438/285; 438/299; 257/269; 257/288; 257/369

(58) Field of Classification Search
USPC .............. 438/14, 197–199, 285, 299; 257/48, 257/288, 269, 368–369
See application file for complete search history.

(56) References Cited

U.S. PATENT DOCUMENTS

| | | | |
|---|---|---|---|
| 7,166,518 B1 | 1/2007 | Foote | |
| 7,744,717 B2 * | 6/2010 | Andrews et al. | 156/247 |
| 2004/0209404 A1 | 10/2004 | Wang et al. | |
| 2005/0082523 A1 | 4/2005 | Blanchet-Fincher et al. | |
| 2005/0285224 A1 | 12/2005 | Tsutsui | |

OTHER PUBLICATIONS

English langauge version of the Internatioanl Search Report from the International Application No. PCT/FI2009/050613 dated Jul. 3, 2009.

* cited by examiner

*Primary Examiner* — Dung A. Le
(74) *Attorney, Agent, or Firm* — Birch, Stewart, Kolasch & Birch, LLP

(57) ABSTRACT

According to an aspect of the invention, a method is provided for manufacturing electronic components. A conducting element comprising a first portion, a second portion and a third portion between the first portion and the second portion is provided. Thermally responsive dielectric material is added at least onto the third portion of the conducting element. Electric current is supplied between the first portion and the second portion of the conducting element causing ohmic heating to affix dielectric material located on the third portion to the third portion. Non-thermally-affixed dielectric material is removed.

9 Claims, 3 Drawing Sheets

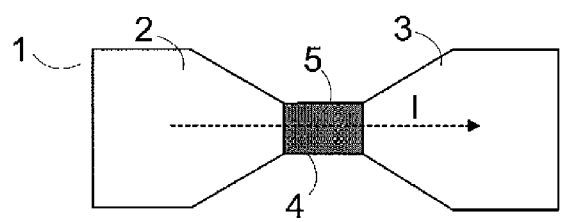
Fig. 1
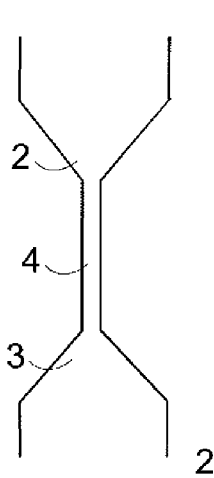 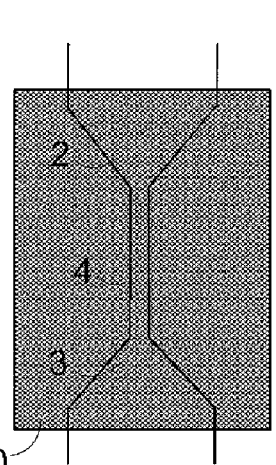 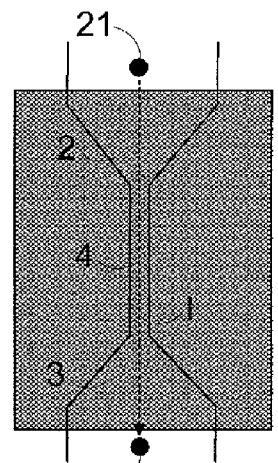 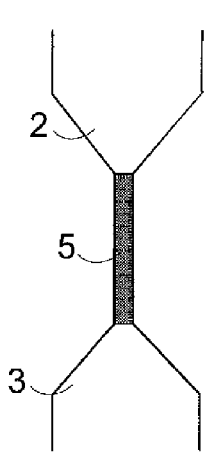
Fig. 2a Fig. 2b Fig. 2c Fig. 2d
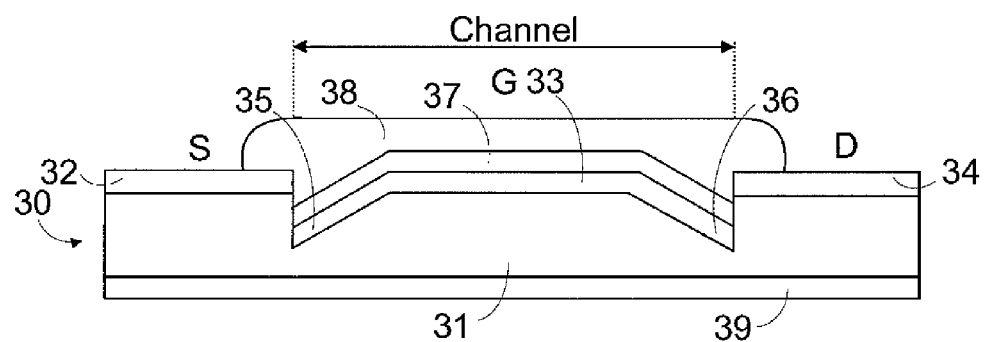
Fig. 3

MANUFACTURING OF ELECTRONIC COMPONENTS

FIELD

The invention relates to embossing electronic components, and in particular to arranging dielectric material on top of a conductive element.

BACKGROUND

Modern integrated circuits, typically silicon based structures, have very high integration density. As one descriptive parameter of this, the number of transistors per given surface area is growing steadily. However, integrated circuit based electronics are not optimal for all applications. For some applications, the integration density and/or speed of the electronics is less crucial. Therefore, for certain applications, different types of printable electronics are becoming more and more interesting.

One approach to reducing transistor cost, while still maintaining acceptable performance, is to produce thin-film transistors on a suitable substrate by printing. Here printing means that at least some device layers have been manufactured by printing techniques. There are several known ways of manufacturing basic conductive patterns of printed circuit boards.

In some manufacturing methods, a dielectric portion needs to be accurately positioned on top of a narrow patterned conducting portion, for instance a printed gate of a transistor. There exists a general need to further improve patterning of dielectric on top of narrow electrically conducting components for achieving accurate patterning of the dielectric and cost-efficient large scale manufacturing.

BRIEF DESCRIPTION

According to an aspect of the present invention, there is provided an improved method for manufacturing electronic components, comprising: providing a conducting element comprising a first portion, a second portion and a third portion between the first portion and the second portion, adding thermally responsive dielectric material onto at least the third portion of the conducting element, supplying electric current between the first portion and the second portion of the conducting element causing ohmic heating to affix dielectric material located on the third portion to the third portion, and removing non-thermally-affixed dielectric material.

According to another aspect, there is provided an apparatus for manufacturing electronic components, comprising means for carrying out the method.

According to a further aspect, there is provided an electronic thin-film component manufactured according to the method.

According to an embodiment, the thermally responsive material is thermally cross-linkable and the affixing of thermally responsive material is provided by cross-linking.

According to an embodiment, the cross-sectional area of the third portion is less than the cross-sectional area of the first portion and the cross-sectional area of the second portion.

According to another embodiment, the conducting element is provided for forming a field-effect transistor structure, and the thermally affixed dielectric forms a gate channel dielectric.

The invention and various embodiments of the invention provide several advantages, which will become apparent from the detailed description below. By the presently claimed arrangement, it becomes possible to pattern a dielectric layer onto a thin portion of an electrode structure in large scale manufacturing, still maintaining good registration and accuracy. For example, a dielectric layer of a transistor structure may be patterned to accurately cover only a gate electrode channel area.

LIST OF DRAWINGS

Embodiments of the present invention are described below, by way of example only, with reference to the accompanying drawings, in which FIG. 1 illustrates a top-view of an electronic component according to an embodiment;

FIGS. 2a to 2d illustrate a method according to an embodiment to manufacture an electronic device;

FIG. 3 illustrates a cross-sectional view of a structure for a transistor device manufactured according to an embodiment;

DESCRIPTION OF EMBODIMENTS

Figure 4A:
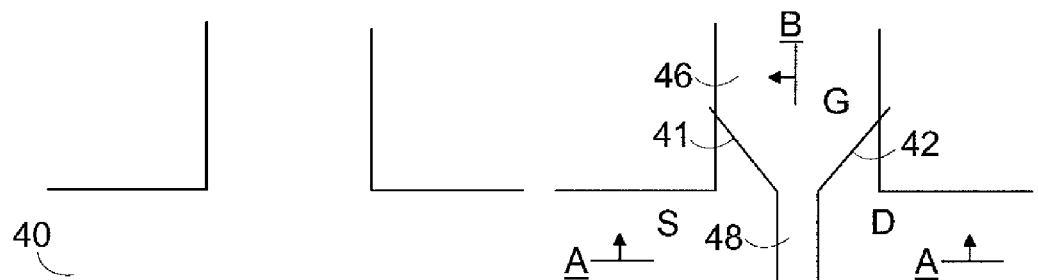
FIGS. 4a to 4e illustrate manufacturing of electronic thin-film components applying embossing according to an embodiment.

Although the specification may refer to "an", "one", or "some" embodiment(s) in several locations, this does not necessarily mean that each such reference is to the same embodiment(s), or that the feature only applies to a single embodiment. Single features of different embodiments may also be combined to provide other embodiments.

FIG. 1 illustrates a simplified top-view of an electronic component 1. The component comprises a conducting element comprising a first portion 2, a second portion 3 and a third portion 4 between the first portion 2 and the second portion 3. The third portion 4 is narrower, i.e. the cross-sectional area of the third portion 4 is less than the cross-sectional areas of the first portion 2 and the second portion 3. It is to be noted that the third portion 4 may additionally or instead be thinner than the first portion 2 and the second portion 3 from a side-view of the electronic component 1.

The electronic component could be a thin-film component, such as a thin-film transistor, for instance. There is a need to attach a dielectric 5 to accurately cover only the narrow third portion 4 of the electronic component, for instance a channel area of transistor gate electrode. There are various known methods to attach the dielectric 5 to the conducting material, such as different printing or lithographic methods.

However, there is a need to develop a further improved method for cost-efficiently attaching dielectric onto a narrow conducting element portion. A small and narrow dielectric may be needed when a number of electrodes of an electronic component, such as a thin-film transistor TFT, are all defined in a single step. Traditionally gate and source-drain electrodes of a transistor are defined in separate steps with the dielectric between these electrodes, whereby there is no need for accurate patterning of the dielectric.

According to an embodiment of the present invention, the dielectric material to be attached is thermally responsive and the dielectric material 5 is affixed to the third portion 4 by ohmic heating causing affixing the dielectric material 5 to the third portion 4. This method and some further embodiments will now be further described below.

FIGS. 2a to 2d further illustrate a method according to an embodiment for manufacturing an electronic device, such as the component 1 of FIG. 1. With reference to FIG. 2a, a conducting element with three portions 2, 3, 4 is provided as an input material.

With reference to FIG. 2b, thermally responsive dielectric material 20 is added onto the conducting element. The dielectric material 20 may be spin-cast or printed, for instance. The dielectric material 20 may be distributed evenly on the area to be coated or the thickness of the dielectric layer may vary. In one embodiment, a manufacturing apparatus carrying out the present method is configured to apply a thinner layer of the dielectric material 20 at least at some distance from the final area to be covered. Material cost savings are also available by adapting the manufacturing apparatus to add the dielectric material to cover the final area as accurately as possible.

As illustrated in FIG. 2c, electric current is supplied between the first portion and the second portion of the conducting element by means of probes 21, 22. Since the cross-sectional area of the third portion 4 is less than the cross-sectional area of the first portion 2 and the second portion 3, the current density in the third portion 4 is increased as compared with the current density in the first portion 2 and the second portion 3. Thus, the temperature of the narrower third portion 4 increases as compared with the first portion 2 and the second portion 3. This may be referred to as ohmic heating (also known as Joule heating and resistive heating) of the third portion 4. By appropriate current, form of the third portion 4, and thermally responsive material, the thermally responsive dielectric material 5 located on the third portion 3 affixes to the third portion 4.

With reference to FIG. 2d, abundant and non-thermally-affixed dielectric material is removed. This abundant material may be rinsed away by an appropriate fluid. Further material, such as a semiconducting material, may then be positioned on top of the dielectric layer, as appropriate.

By the above-illustrated method for dielectric fabrication, it becomes possible to pattern a dielectric layer on a thinned portion of an electrode structure in large scale manufacturing, still maintaining good registration and accuracy.

In one embodiment, the conducting element 1 is provided for forming a transistor structure and the thermally affixed dielectric 5 forms a gate dielectric for the transistor. Some examples of transistor-related embodiments are further illustrated below. However, the present features for affixing dielectric material onto a narrow portion 4 of a conductor may be applied for manufacturing various types of electronic components.

There are many dielectric materials available for application as the thermally-responsive material 20. Many of the polymeric dielectrics already used in transistors may be applied. Currently the most common such dielectrics are polymethylmethacrylate PMMA, polyvinylchloride PVC, polyamide PI, polyethylene PE, polyvinyl alcohol PVA, cyanoethylpullulan CYPEL, polystyrene PS, poly(4-vinylphenol) PVP.

Table 1 below illustrates some polymeric dielectrics which may be used as the thermally-responsive material 5, 20.

TABLE 1

| | Dielectric System | Curing Conditions | Dielectric Constant |
|---|---|---|---|
| C-PVP | poly(4-vinylphenol)-4,4'-(hexafluoroisopropylidene)-diphthalic anhydride | 2 h at 100° C. | 4.2 |
| | poly(4-vinylphenol)-suberoyl chloride | 2 h at 100° C. | |
| | poly(4-vinylphenol)-1,12-bis(trichlorosilyl)-dodecane | 10-15 min at 100° C. | 6.5 |
| C-PS | polystyrene-1,12 bis(trichlorosilyl)-dodecane | several h at 100° C. | 2.9 |
| C-PMMA | polymethylmethacrylate-1,6-bis(trichlorosilyl)-hexane | not needed | |
| PVP | poly(4-vinylphenol) | 2 h at 100° C. | 6.4 |
| PS | polystyrene | 2 h at 100° C. | 2.6 |
| PMMA | polymehtylmethacrylate | | |
| CYPEL | cyanoehylpullulan | | 12-18.5 |
| PVC | polyvinylchloride | | |
| PI | polyimide | | |
| PVA | polyvinlyalcohol | | 7.8-10 |

In one embodiment, the affixing of the thermally responsive material portion 5 is provided by cross-linking. In a further embodiment, the thermally responsive material 20 is thermally cross-linkable at a relatively low temperature, in the range of around 70-150 degrees Celsius. In the table, the three first dielectrics are examples that crosslink when heated and can be used with different cross-linking agents. Some examples of such cross-linking agents are 4,4'-(hexafluoroisopropylidene)diphthalic anhydride, suberol chloride, 1,12-bis(trichlorosilyl)dodecane, 1,6-bis(trichlorosilyl)hexane. These materials can be processed from solution and can be spin-cast or printed.

A cross-linking agent may be blended with a dielectric material, such as one of the materials identified in Table 1, and the solution is used as the dielectric material 5, 20. The dielectric properties of these dielectric materials change when a cross-linking agent is blended with them. However, there are also cross-linkable materials available not requiring the use of a cross-linking agent. The advantage of cross-linking can be better dielectric properties, namely a higher dielectric constant and breakthrough voltage. A further important advantage of the present method is the possibility to wash off the remaining, non-cross-linked dielectric. Cross-linked materials are in general insoluble after the cross-linking process has been completed.

One further example of a cross-linkable material which may be applicable is PVP+4,4'-(hexafluoroisopropylidene) diphthalic anhydride (HDA) or suberoyl chloride (SC); reference is made for further information in *Water-stable organic transistors and their application in chemical and biological sensors*, M. E. Roberts, S. C. B. Mannsfeld, N. Queraltó, C. Reese, J. Locklin, W. Knoll, Z. Bao, PNAS 105 (2008) 12134. Further general information on dielectric materials suitable for TFTs is available in *Gate Dielectrics for Organic Filed-Effect Transistors: New Opportunities for Organic Electronics*, A. Facchetti, M.-H. Yoon, T. J. Marks., Adv. Mater. 2005, 17, 1705-1725.

The last seven dielectrics in Table 1 are examples of common non-cross-linkable organic dielectrics, commonly used for organic thin-film transistors OTFTs. These can be cured by heat. Because they do not cross-link, they can be soluble even after curing. It may be possible that these dielectrics can be printed, cured and the uncured part washed off, however, that will be more difficult than with the cross-linkable materials. Thus, at least some of such other dielectrics may also be applicable as the dielectric material 5, 20. Additionally other dielectrics exist, for example inorganic dielectrics and self-assembled small molecules. At least some of such other dielectrics may also be applicable as the dielectric material 5, 20 affixed according to the method illustrated above.

The fluid applied for removing the abundant dielectric material (step illustrated in connection with FIGS. 2c and 2d) is dependent on the dielectric material 20 used. Typically, a cross-linked material is insoluble after the cross-linking process. Thus, a solvent of a dielectric solution may be used for this purpose. Some examples of applicable solvents include: non-polar solvents, such as toluene, xylenes and chloroform, polar aprotic solvents, such as acetone, dimethylformamide and dimethyl sulfoxide, and polar protic solvents, such as water, isopropanol, methanol, ethanol and formic acid.

The above-illustrated features may be applied to many types of transistors. In the following some embodiments are further illustrated, in which the transistor electrodes of a thin-film transistor are separated by embossing, which may also be referred to as imprinting. As compared with traditional printing of electronics structures, embossing provides simple and economic mass production with the possibility to obtain smaller and better-controlled details in the electronic structures.

FIG. 3 illustrates a cross-sectional view of a structure for a transistor device 30 manufactured according to an embodiment. A source (S) portion 32, a gate (G) portion 33, and a drain (D) portion 34 are provided by a conductive layer on a compressible layer 31. In the embodiment of FIG. 3, the gate 33 is formed by an embossing operation applied only to edges of the gate area 33 of the conductive layer being separated. Thus, at least one portion 35, 36 of the gate 33 is positioned on a different level, in a transverse direction in relation to the plane of the compressible layer than the source 32 and/or drain 34, whereas the remaining part(s) of the gate 33 may remain substantially on the same level as the source 32 and/or the drain 34.

The gate 33 has been separated from an initial unitary conductive layer by an embossing tool having at least one protrusion forcing a compressible and substantially non-conductive layer 10 to compress and form a gap, in the present embodiment of a triangle form. However, it is to be appreciated that various other shapes may be applied.

The compressible layer 31 may form a substrate for the transistor device. In an alternative embodiment shown in FIG. 3, a further substrate layer 39 is provided below the layer 31 in the vertical direction. The compressible layer 31 may be any of a variety of suitable compressible plastics, enabling a permanent deformation by embossing in suitable conditions. Examples of suitable plastics for the compressible layer 50 include polyester (PET), polyimide (PI), polystyrene (PS), polycarbonate (PC), polymethyl methacrylate (PMMA), polyether imide (PEI), polytetrafluoroethylene (PTFE/Teflon) or polyetheretherketone (PEEK).

The conductive layer and the electrodes 32, 33, 34 may be any of a variety of suitable conductive materials for forming electrode patterns of thin-film transistor structures. For example, transparent semiconductor oxides, metals, or conducting polymers may be applied. In certain applications, the conductor material may be metal or carbon particle ink.

A dielectric layer 37 is formed on top of the embossed gate electrode 60 to form an insulator. The dielectric 37 is thermally responsive and affixed by applying the method illustrated in FIGS. 2a to 2d. In one embodiment the dielectric 37 is cross-linkable, for instance some of the above-identified dielectric materials may be applied.

Semiconductive material is deposited on top of the dielectric layer 37 to form a semiconductor 38. There is a very large number of possible semi-conductors, both organic and inorganic, p-type and n-type, soluble and insoluble. Examples of suitable semiconductor materials are various polymeric semiconductor materials, such as polythiophene and polyacetylene. Examples of p-type organic semiconductors are pentacene, 6T (sexithiophene), P3HT (regio-regular poly[3-hexylthiophene]), F8T2 (poly[9,9'dioctylfluorene-co-bithiophene]), PTAA (polytriarylamine), PQT (poly[5,5'-bis (3-alkyl-2-thienyl)-2,2'-bithiophene]), PBTTT (poly[2,5-bis (3-alkylthiophen-2-yl)thieno(3,2-b)thiophene]), PVT (poly [2,5-thienylene vinylene]), DH-5T ($\alpha,\omega$-dihexylquinquethiophene), and DH-6T ($\alpha,\omega$-dihexylsexithiophene). The semiconductor 38 may be printed or patterned. However, it will be appreciated that other suitable semiconductive materials and/or deposition methods may be applied. With the illustrated embodiment in which the dielectric 37 covers only the gate electrode 33, the semiconductor 38 can be deposited over the channel area.

FIGS. 4a to 4e illustrate manufacturing of electronic thin-film components applying embossing according to an embodiment. The method can be used for manufacturing transistors, and references are also made to the structure of FIG. 3. However, the method is not limited to the embodiment of FIG. 3.

Figure 4B:
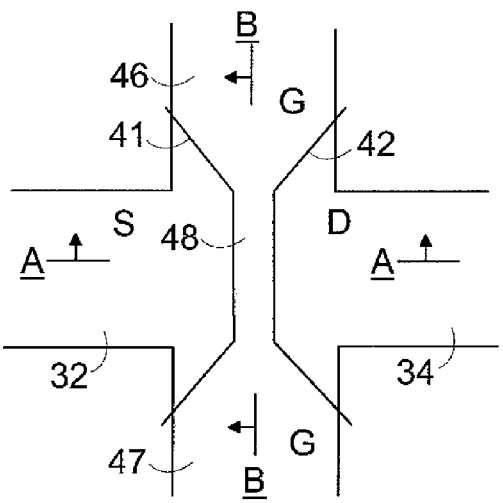

As illustrated in FIG. 4a, a pre-patterned metal layer 40 on a substrate is first provided. Then, an embossing operation is applied to define the source electrode 32, the gate electrode 33 and the drain electrode 34. FIG. 4b illustrates two embossed lines 41, 42 separating the gate electrode 33 from the source electrode 32 and the drain electrode 34.

The embossing operation is performed by bringing an embossing tool, which may be also referred to as an embossing mold or a pressing plate, into contact with the input material 40 under suitable conditions, such as at an appropriate temperature. The tool comprises one or more protrusions, which may be referred to as stamps, driven to a portion, such as portions 35, 36 in FIG. 3, of the conductive layer material. The compressible layer material 31 is deformed and the stamps break the conductive layer 31 to separate the electrodes 32, 33, 34. By applying a tool with at least two stamps, a single embossing operation may be applied to produce the two embossed lines 41, 42, having a first distance within a first portion and a second gate portion to form gate contact portions 46, 47 and a second distance within a third gate portion to form a transistor channel portion 48.

In one embodiment nanoprint lithography, which may also be referred to as hot embossing or thermoplastic embossing, is applied. The compressible layer 31 may be cured by heating during the embossing process. The stamps may be, instead of or in addition to the heating of the compressible layer 31, heated prior to being brought into contact with the conductive layer. In another embodiment, photo nanoprint lithography is applied, whereby the compressible layer 31 is cured by heating or ultraviolet UV light during the embossing process. A still further applicable method is electrochemical nanoimprinting using a stamp made from a superionic conductor, such as silver sulfide. However, the present embossing features may be applied also in various other current and future embossing or imprinting methods.

Figure 4C:
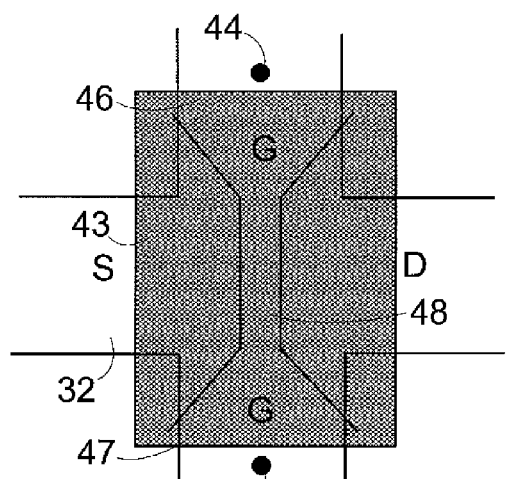

As illustrated in FIG. 4c, thermally responsive dielectric material 43 is added onto the embossed structure. In one embodiment, the dielectric material 43 is cross-linkable and spin-coated. However, also other adjusting methods may be applied. For instance, printing methods such as gravure, reverse gravure, flexography, ink-jet, or screening may be applied. Electric current is supplied via probes 44, 45 between the first portion 46 and the second portion 47 of the separated gate electrode 33. The electric current causes ohmic heating of the channel portion 48 of the gate electrode 33 causing affixing dielectric material 37 located on the channel portion 48 to the third portion 33. This provides a locally accurately defined dielectric covering only the gate electrode 33.

In the case of ink-based embodiments, the ink is typically dried, i.e. solvents evaporated, before the ohmic heating causes the cross-linking. If cross-linking by heat is combined with the heat drying process, the excess temperature required by ohmic heating is smaller and time shorter.

Figure 4D:
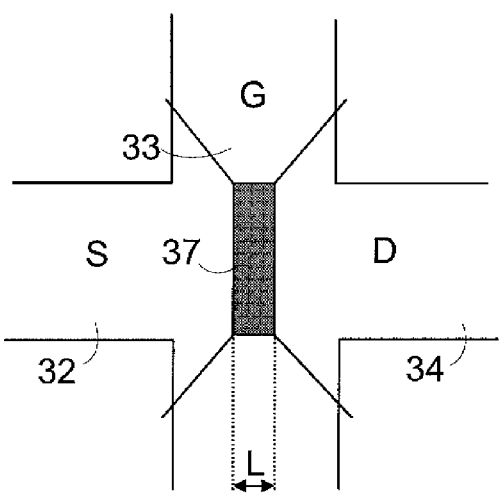
Figure 4E:
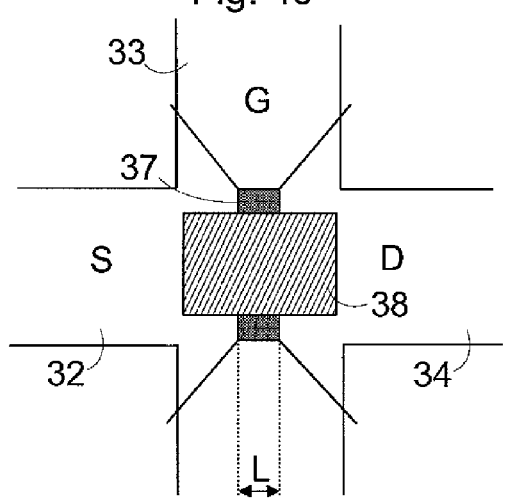

Abundant and non-thermally-affixed dielectric material is then removed from the conducting element. FIG. 4*d* illustrates the transistor structure after removal of the abundant material. As illustrated in FIG. 4*e*, the semiconductor 38 may then be added on top of the dielectric layer 37 on the gate portion 48.

Reference is made to PCT application PCT/FI20081050695 as regards further details on one embodiment for arranging the embossing features, the transistor electrode embossing related description of which, in particular FIGS. 3*a* to 5 and their related disclosure, is included herein by reference.

A transistor channel length is defined as the distance between the source and drain electrodes 32, 34. As illustrated in FIG. 3, the distance between the terminating ends of the two embossed gate portions 35, 36 defines the transistor channel length. FIG. 4*d* also illustrates the transistor channel length L.

The embodiment illustrated in FIGS. 3 and 4*a* to 4*e* enables definition of a high performance three-electrode transistor structure that can be manufactured using a single embossing step producing two imprinting lines 41, 42 at the same time. The dielectric material 20, 43 does not have to be accurately positioned (the step illustrated by FIGS. 2*b* and 4*c*) onto the (embossed) electrode structure, but may substantially extend on the non-insulated portions (32, 34). There is no need for alignment between successive steps, which increases manufacturing simplicity and enables very high transistor-to-transistor repeatability. By applying the present method, both the TFT electrode and the dielectric require no demanding registration accuracy as the source-drain 32, 34 and the gate 33 are defined in one step and the dielectric 37 is defined to the specific location by heating the gate electrode 33.

It is possible to manufacture very narrow TFT channels accurately with manufacturing tools that are suitable for large-scale manufacturing. By the present embossing arrangement producing electrodes having variable width, it becomes easier to arrange further electrical contacts. Although the gate electrode may be large at a distance, a micrometer size channel 48 may be imprinted and insulated by the above-illustrated method. It is expected that minimum channel lengths L in the range of 0.1-50 µm may be achieved by the present method. It is expected that the above-illustrated dielectric affixing method is particularly advantageous to channel lengths L of around 1-10 µm. Such narrow channels increase transistor performance and such transistors are well suitable for manufacturing radio frequency identification RFID circuitry, for instance.

Figure 5A:
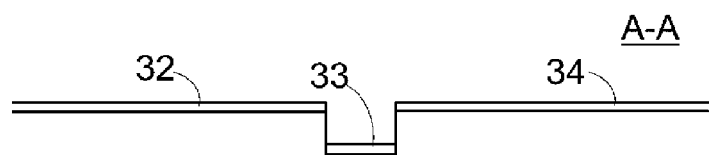
FIGS. 5a and 5b illustrate cross-sectional views of a structure after embossing and suitable for another transistor device according to an embodiment.
Figure 5B:
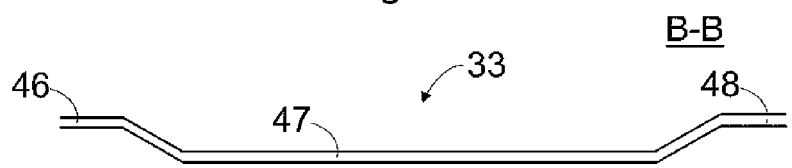

FIGS. 5*a* and 5*b* illustrate simplified cross-sectional views of another conductor structure after embossing and suitable for a transistor device manufactured according to an embodiment. FIG. 5*a* illustrates cross-sectional view A of FIG. 4*b*. FIG. 5*a* illustrates cross-sectional view B of FIG. 4*b*. Instead of the embodiment illustrated in FIG. 3 (which illustrates a cross sectional view A to A of FIG. 4*b* according to another embodiment), the entire gate 33 channel portion 48 is now embossed. The stamp is formed such that the contact is broken in direction A to A', but maintained in direction B to B'. The above-illustrated features may be applied to affix the dielectric portion 37 on top of the gate channel portion 47.

The above embodiments in FIGS. 3 to 5*b* illustrated separation of the electrodes by imprinting. However, the present steps related to dielectric fabrication and patterning may be applied in a system applying some other method for forming the electrodes before affixing the dielectric material portion 5, as illustrated in FIGS. 1 to 2*d*. Some further examples of such methods include ink-jet, gravure, flexography, screen, offset, pad or micro-contact printing, wet etching, photolithography, nano-imprint lithography, and laser ablation.

The above embodiments illustrate application of a conductor in which the cross-sectional area of the third portion 4 is less than the cross-sectional areas of the first portion 2 and the second portion 3. However, it is not necessary for realisation of the present process that the cross-sectional area of the third portion 4 of the conductor is smaller than in the first portion 2 and the second portion 3, i.e. that the third portion is narrower and/or thinner. A manufacturing process according to such an alternative embodiment is illustrated in simplified FIGS. 6*a* to 6*d*, applying similar references as in FIGS. 2*a* to 2*d*.

Figure 6A:
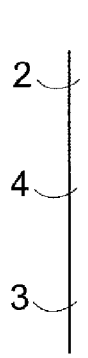
FIGS. 6a to 6d illustrate a method according to another embodiment to manufacture an electronic device.
Figure 6B:
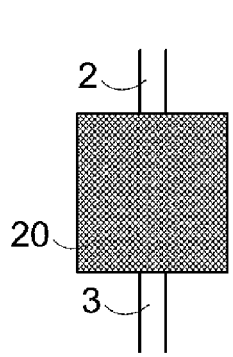
Figure 6C:
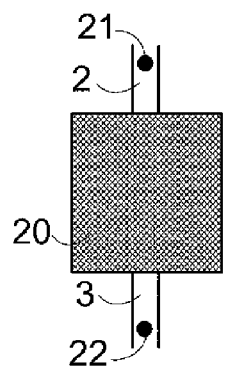
Figure 6D:

In one embodiment, the third portion 4 is of a different material than the first portion 2 and the second portion 3 such that the resistivity of the third portion 4 is highest. Thus, even if the cross-sectional area of the third portion 4 is substantially the same as that of the first portion 2 and the second portion 3, as illustrated in FIG. 6*c*, when supplying electric current between the first portion 2 and the second portion 3, the third portion 4 will heat more than the first and the second portion. Hence, affixing the dielectric portion 5 on top of the third portion 4 can be achieved, based on cross-linking of the dielectric material 20 caused by the ohmic heating, for instance. For instance, portions 1 and 2 may be of bulk copper, typically having resistivity around $1.7\times10^{-8}$ ohm m at 20° Celsius, and the third portion 4 could be printed silver ink, typically having around 3 to 10 times higher resistivity. At least some of the further features illustrated above may be applied also with this embodiment, such as the features related to manufacturing transistors wherein the dielectric is affixed on the gate electrode 60.

The process illustrated above can be applied also to a homogenous conductor. The embodiment with a homogeneous conductor will not provide heating/affixing resolution along the conductor, but all the dielectric material placed on the conductor will be consistently affixed. However, in many cases sufficient resolution along the conductor can be provided by deposition of dielectric. In compact circuitry the available space is limited and it might be practical to provide the current along narrow homogeneous lead lines that are factually heated similarly as the portion of conductor that is to be coated by dielectric material. In circuits it is also practical that several portions of circuitry are coated by dielectric and heated simultaneously by the same current supply. At least some of the further features illustrated above may be applied also with this embodiment.

Figure 7:
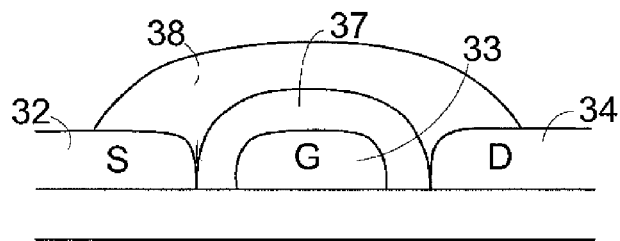
FIG. 7 illustrates a cross-sectional view of a structure for a transistor device according to an embodiment.

FIG. 7 illustrates a further example of a transistor structure, which may be manufactured by applying some or all of the above-illustrated dielectric affixation features. Similar references as in previous embodiments are used for representing the transistor elements, but it will be appreciated that different manufacturing methods not based on the above-illustrated imprinting may be used to arrive at the structure illustrated in FIG. 7. At least some of the above-illustrated features may be applied also to other types of transistor structures.

According to an aspect of the present invention, the dielectric material portion 5, 37 located on the third portion 4, 33 is affixed, instead of or in addition to the above illustrated ohmic heating, to the third portion 4 by means of heating, pressure and/or radiation, for instance by ultra-violet light. Thus, an appropriately configured, for instance exposure time and intensity, heating (by some other heating means than ohmic heating), pressure and/or radiation operation may be used to initiate chemical reactions causing cross-linking of the dielectric material portion 5, 37.

There are various dielectrics which are suitable for this purpose. For instance, in table 1, the three first dielectrics are examples that cross-link when heated. The pressure-based affixation of the dielectric portion 5, 37 may be arranged by first adding the dielectric material and then applying an embossing operation and pressure to affix the dielectric material portion 5, 37, for instance.

As regards affixing based on (ultraviolet) light, photosensitive dielectrics may be applied as the dielectric material 5. In this embodiment, a transparent stamp, for instance of sapphire stamp partly covered by metal, could be applied to cause cross-linking of the dielectric material portion 5 simultaneously with the imprinting.

The manufacturing of electronic components by applying at least some of above-illustrated embodiments may be arranged in various ways. An apparatus for manufacturing electronic components, such as thin-film transistors, comprises means for performing at least some the steps illustrated above in connection with FIGS. 2a to 4e.

Figure 8:
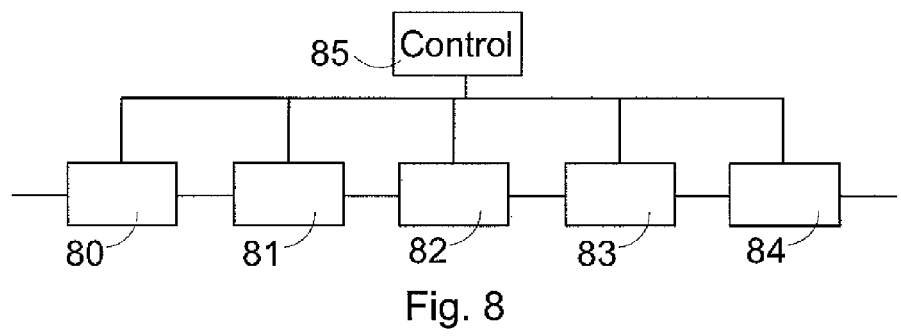
FIG. 8 illustrates an apparatus for producing electronic components according to an embodiment.

For instance, and as illustrated in the simplified FIG. 8, such a production apparatus may comprise a unit or an element for each or at least some of the following production stages: input of the conducting element 80, forming or separation of the electrodes 81, addition of the thermally responsive dielectric material 82, affixing of a thermally responsive dielectric material on the specified portion of a separated electrode by applying ohmic heating 83 as illustrated above, removal of abundant dielectric material 84, and addition of further material onto the affixed dielectric portion. The apparatus may comprise an input supplier 81 configured to provide, such as generate or receive, the conducting element comprising the first portion 2, the second portion 3 and the third portion 4. In one embodiment, the supplier 81 is configured to imprint the electrode structure as illustrated in connection with FIGS. 4a, 4b, 5a, and 5b. The apparatus also comprises a dielectric placer 82 configured to add the thermally responsive dielectric material 20 onto the conducting element 1, current supply 83 and connectors configured to supply the electric current between the first portion 2 and the second portion 3, and a dielectric material remover 84 configured to remove the non-thermally-affixed dielectric material from the conducting element. It is to be noted that one or more of the units 80 to 84 may be arranged to perform one or more sub-steps related to the production stage by the unit. For instance, the unit and production stage 82 may also involve further surface treatment actions, for instance plasma treatment, multi-step ink transposition, and ink drying.

As regards the affixing (83) of the dielectric material illustrated in connection with FIGS. 2c and 4c, an appropriate current supply is configured in the production apparatus on the basis of the properties of the dielectric material and the conducting portion 4. The amount of the current applied is dependent on the resistivity and cross-linking temperature of the dielectric material 20 and the dimensions of the conducting element 4 (thickness and width). There may be a measurement unit measuring the temperature or other status associated with the dielectric affixing procedure. The current supply of the production apparatus may be automatically controlled in accordance with the detested status of the affixing procedure, for instance in response to a status signal from the measurement unit.

In one embodiment, a roll-to-roll process is applied. Thus, an apparatus for a roll-to-roll electronic thin-film component manufacturing process system may comprise a web of input film obtained from a first rotated roll and a web of output film rolled on a second rotated roll, which includes the products illustrated in FIG. 3, 4e, or 6d, for instance.

The apparatus configured for at least some of the above-illustrated manufacturing steps is controlled by at least one computer-based control block, control unit, or controller, as illustrated by block 85 in FIG. 8. Such a controller may be implemented by a suitably programmed computer program and executed in a processor of the apparatus. The computer program may be stored in a computer program storage medium, such as an internal memory of the apparatus or an external memory connectable to the apparatus. A specific hardware unit, which may embody software-controlled features, in one embodiment, controls at least some of the steps for manufacturing electronic thin-film components according to embodiments.

The features illustrated above may be applied to various applications of electronic devices. As already indicated, various radio frequency identification tags, for instance, are devices to which at least some of the above-illustrated features may be applied and particular advantages may be achieved. However, the present features may be applied in a wide variety of devices in which it is feasible to use transistors or other electrode structures by applying the above-illustrated features. Some further examples include active matrix displays and organic light-emitting diode (OLED) drivers, for instance.

It will be obvious to a person skilled in the art that, as technology advances, the inventive concept can be implemented in various ways. The invention and its embodiments are not limited to the examples described above but may vary within the scope of the claims. The features of the embodiments described herein may be combined in all possible combinations of methods, apparatuses, and products. The combinations of claim elements as stated in the claims can be changed in a number of different ways and still be within the scope of various embodiments of the invention.

The invention claimed is:

1. A method for manufacturing electronic components, comprising:
    providing a conducting element comprising a first portion, a second portion and a third portion between the first portion and the second portion, wherein the cross-sectional area of the third portion is less than the cross-sectional area of the first portion and the cross-sectional area of the second portion,
    adding thermally responsive dielectric material at least onto the third portion of the conducting element,
    supplying electric current between the first portion and the second portion of the conducting element causing ohmic heating to affix dielectric material located on the third portion to the third portion, and
    removing non-thermally-affixed dielectric material.

2. The method of claim 1, wherein the cross-sectional area of the third portion is less than the cross-sectional area of the first portion and the cross-sectional area of the second portion.

3. The method of claim 1, wherein the thermally responsive material is thermally cross-linkable and the affixing of thermally responsive material is provided by cross-linking.

4. The method of claim 1, wherein the conducting element is provided for forming a field-effect transistor structure, and the thermally affixed dielectric forms a gate channel dielectric.

5. The method of claim 4, wherein a source, a drain, and the gate are formed substantially on the same level on top of a substrate.

6. The method of claim 4, wherein the source, the drain and the gate are formed by one of: ink-jet, gravure, flexography, screen, offset, pad or micro-contact printing, nano-imprint lithography, wet etching, photolithography, or laser ablation.

7. The method of claim 4, wherein the source, the drain and the gate are separated by an embossing operation.

8. The method of claim 7, wherein an input material comprising a compressible layer and a conductive layer on the compressible layer is provided, and a single embossing operation is performed on the conductive layer to separate the gate by at least two embossed lines.

9. The method of claim 1, wherein the dielectric material is low-temperature cross-linkable dielectric material selected from a group comprising: polymethylmethacrylate PMMA, polyvinylchloride PVC, polyamide PI, polyethylene PE, polyvinylalcohol PVA, cyanoethylpullulan CYPEL, polystyrene PS, poly(4-vinylphenol) PVP.

* * * * *